US008068346B2

(12) United States Patent
Maier et al.

(10) Patent No.: US 8,068,346 B2
(45) Date of Patent: Nov. 29, 2011

(54) CIRCUIT BOARD WITH HIGH DENSITY POWER SEMICONDUCTORS

(75) Inventors: Josef Maier, Munningen (DE); Daniel M. Lynch, Caledonia, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 2022 days.

(21) Appl. No.: 10/838,406

(22) Filed: May 4, 2004

(65) Prior Publication Data

US 2005/0248023 A1 Nov. 10, 2005

(51) Int. Cl.
*H05K 7/00* (2006.01)

(52) U.S. Cl. ......... 361/760; 361/781; 361/783; 174/252

(58) Field of Classification Search .................. 361/760, 361/715, 826, 781, 783, 777, 124–125, 713, 361/862, 775, 796; 174/260–261, 68.2, 72 B, 174/250, 255, 252
See application file for complete search history.

(56) References Cited

U.S. PATENT DOCUMENTS

| | | | |
|---|---|---|---|
| 3,372,308 A * | 3/1968 | Sarazen et al. ............... 361/735 |
| 4,635,165 A | 1/1987 | Okuaki | |
| 5,067,905 A * | 11/1991 | Matsumoto et al. ......... 439/76.2 |
| 5,153,449 A * | 10/1992 | Crook et al. .................. 307/66 |
| 5,162,613 A | 11/1992 | Schoenthaler | |
| 5,294,826 A | 3/1994 | Marcantonio | |
| 5,363,552 A | 11/1994 | Coniff | |
| 5,523,919 A * | 6/1996 | Canova ........................ 361/720 |
| 5,605,715 A * | 2/1997 | Giardina et al. ............. 156/151 |
| 5,644,103 A | 7/1997 | Pullen | |
| 5,737,187 A | 4/1998 | Nguyen | |
| 5,812,375 A * | 9/1998 | Casperson .................... 361/707 |
| 5,812,376 A | 9/1998 | Mach | |
| 5,886,407 A | 3/1999 | Polese | |
| 5,995,370 A | 11/1999 | Nakamori | |
| 6,000,952 A * | 12/1999 | Gladd et al. ................. 439/76.2 |
| 6,061,241 A * | 5/2000 | Handforth et al. ............ 361/704 |
| 6,122,704 A | 9/2000 | Hass | |
| 6,157,538 A | 12/2000 | Ali | |
| 6,219,243 B1 | 4/2001 | Ma | |
| 6,219,254 B1 | 4/2001 | Akerling | |
| 6,266,244 B1 | 7/2001 | Guthrie | |
| 6,316,737 B1 | 11/2001 | Evans | |
| 6,331,451 B1 * | 12/2001 | Fusaro et al. ................. 438/126 |
| 6,349,033 B1 | 2/2002 | Dubin | |
| 6,400,032 B1 | 6/2002 | Akram | |
| 6,466,451 B2 * | 10/2002 | Mizuno et al. ................ 361/796 |
| 6,480,014 B1 | 11/2002 | Li | |
| 6,494,723 B2 * | 12/2002 | Yamane et al. .............. 439/76.2 |
| 6,538,878 B1 * | 3/2003 | Acker et al. .................. 361/624 |
| 6,545,352 B1 | 4/2003 | Ruckdeschel | |
| 6,570,249 B1 | 5/2003 | Liao | |
| 6,600,658 B2 * | 7/2003 | Iwata ............................ 361/752 |
| 6,610,926 B2 * | 8/2003 | Chiriku et al. .................. 174/60 |

(Continued)

*Primary Examiner* — Hoa C Nguyen

(74) *Attorney, Agent, or Firm* — Carlson, Gaskey & Olds, PC

(57) ABSTRACT

A circuit board is provided with a plurality of MOSFETs (metal oxide semiconductor field effect transistors) each of which include a field effect transistor and an associated control circuit. The control circuits are mounted in a control section of the board remote from a power section mounting the MOSFETs. The present invention reduces the assembly steps required in the prior art wherein the MOSFET and its control circuit were mounted as preassembled units to the board. Moreover, the number of MOSFETs per unit area of board is increased by the present invention.

10 Claims, 5 Drawing Sheets

U.S. PATENT DOCUMENTS

| | | |
|---|---|---|
| 6,611,916 B1 * | 8/2003 | Cacace-Bailey et al. ......... 726/6 |
| 6,630,371 B2 | 10/2003 | Hembree |
| 6,664,130 B2 | 12/2003 | Akram |
| 6,693,370 B2 * | 2/2004 | Yamane et al. .............. 307/10.1 |
| 6,927,344 B1 * | 8/2005 | Gall et al. ..................... 174/254 |
| 2003/0107138 A1 | 6/2003 | Tian |
| 2005/0056457 A1 * | 3/2005 | Gall et al. ..................... 174/254 |

* cited by examiner

CIRCUIT BOARD WITH HIGH DENSITY POWER SEMICONDUCTORS

BACKGROUND OF THE INVENTION

The present invention is directed to a circuit board having a plurality of power semiconductors, such as metal oxide semiconductor field effect transistors (MOSFETs) for handling electrical power. As is known, each MOSFET is associated with a control circuit and resistor elements. The present invention separates these three components into at least two sections on the circuit board. Thus, the MOSFETs are mounted as separate units directly to the board in a power section, with the control circuits mounted in a control section.

In the prior art, circuit boards for handling power typically include a plurality of MOSFETs. These MOSFETs have historically been mounted to a board substrate as a number of preassembled units. Each of the preassembled units includes the control circuit, as well as the MOSFET. Further, the subassemblies have typically been provided with separate, ceramic layers carrying the MOSFET and the control circuit. Resistors are sometimes mounted between the two ceramic layers. An outwardly extending mount structure attaches all of these components as a preassembled unit to the board substrate.

The prior art circuit boards had undesirably high assembly time and cost due to the various steps required to form the subassembled unit. Further, preassembled units require more space than would be desirable, and thus reduced the available "density" of MOSFETs per given area of circuit board.

SUMMARY OF THE INVENTION

In a disclosed embodiment of this invention, at least the control circuits for the power semiconductors, and the power semiconductors themselves, are mounted in separate sections. The control circuits are preferably associated with individual ones of the power semiconductors through circuit traces. By separating the two components, the two components can be mounted directly to the board, without any detailed or complex intermediate assembly steps. Moreover, the control for each power semiconductor is preferably also mounted in the same section as controls for the whole board. A thermal barrier is preferably mounted between a control section (carrying the controls) and a power section (carrying the power semiconductors, such as MOSFETs).

The present invention reduces the number of steps required to form a circuit board including a plurality of power semiconductors, and further allows for a greater density of power semiconductors per unit area of circuit board.

These and other features of the present invention can be best understood from the following specification and drawings, the following of which is a brief description.

DETAILED DESCRIPTION OF THE PREFERRED EMBODIMENT

Figure 1:
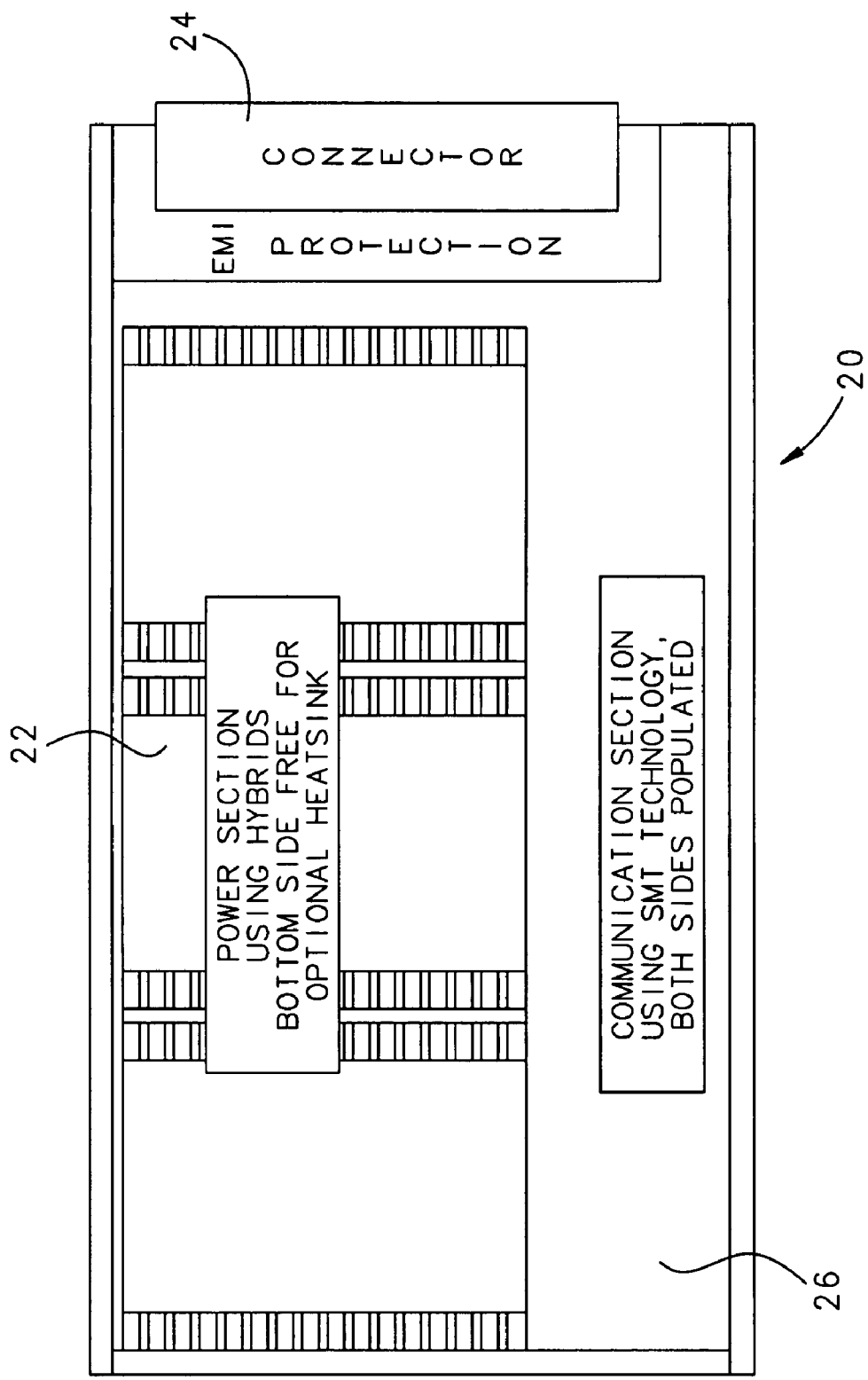
FIG. 1 is a plan schematic view of the prior art circuit board.

A circuit board 20, as known in the prior art, is illustrated in FIG. 1. The circuit board is of a type utilized in power distribution networks, and in particular for aerospace applications. A number of power MOSFETs are associated with a power section 22 on the circuit board 20. A connector 24 communicates through the circuit board 20 between a power supply and components to be powered. A communication section 26 includes control circuits, but control circuits generally for the entire circuit board 20, rather than a particular control circuit for each of the MOSFETs in the power section 22. While power MOSFETs are specifically disclosed, it should be understood that this invention would extend to circuit boards utilizing other types of power semiconductors. As an example, IGBTs, thyristors, SCRs, diodes, etc. could be utilized under the teachings of this invention.

Figure 2:
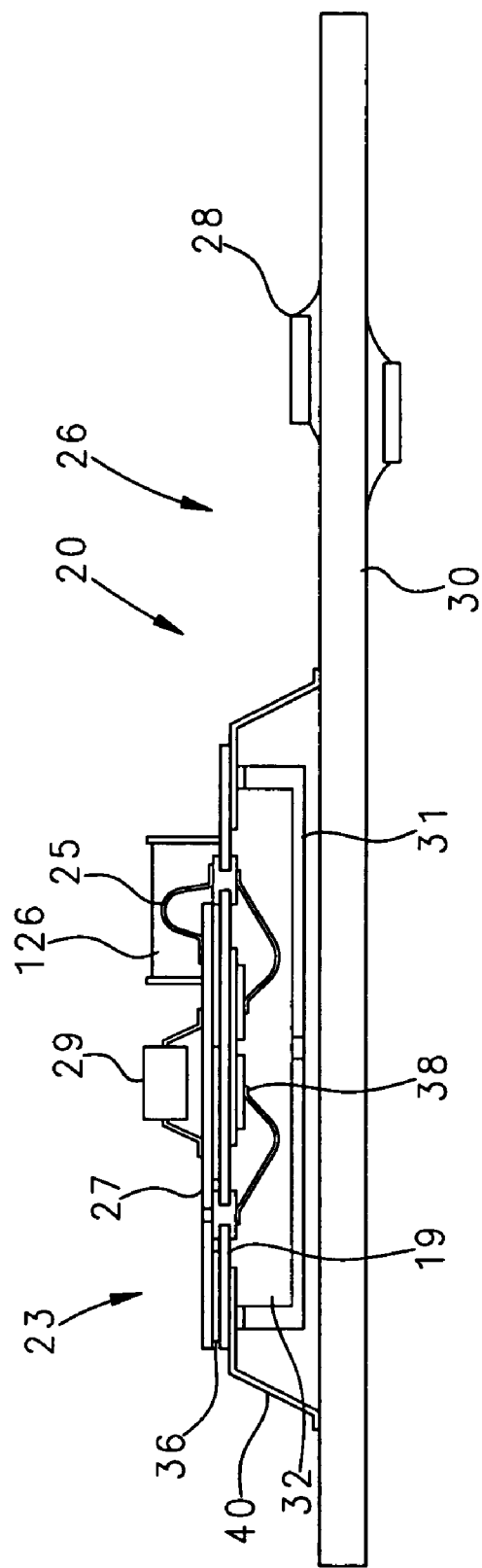
FIG. 2 is a cross-sectional view through the FIG. 1 circuit board.

As shown in FIG. 2, the board substrate 30 receives a number of preassembled units 23, known in the art as "hybrid" units. The hybrid units are generally preassembled units 23 incorporating the MOSFET 38 mounted to one ceramic layer 19, a surface mount technology (SMT) control circuit 29 mounted to another ceramic layer 27, and resistors 36 sandwiched between the two ceramic layers 19 and 27. Wire bond 25 electrically connects the ceramic layer 27 to layer 19, and is encapsulated at 126. Potting material 32 is formed within a cap 31, and an outer mount structure with pins 40 holds the entire preassembled unit 23 to board substrate 30. The potting materials environmentally protect the components and the boards. Control circuit 28 is mounted in communication section 26, and is a control for the circuit board 20, rather than any individual one of the preassembled units 23.

The prior art required a good number of separate assembly steps to form the preassembled units 23. Each of the individual components was assembled together to form the preassembled units 23. Moreover, as can be appreciated from FIG. 2, a good deal of additional space is required outwardly of the MOSFET 38 to house all of the various components and the pins 40. Thus, the prior art did not utilize the space on board substrate 30 as effectively as may be desired.

Figure 3:
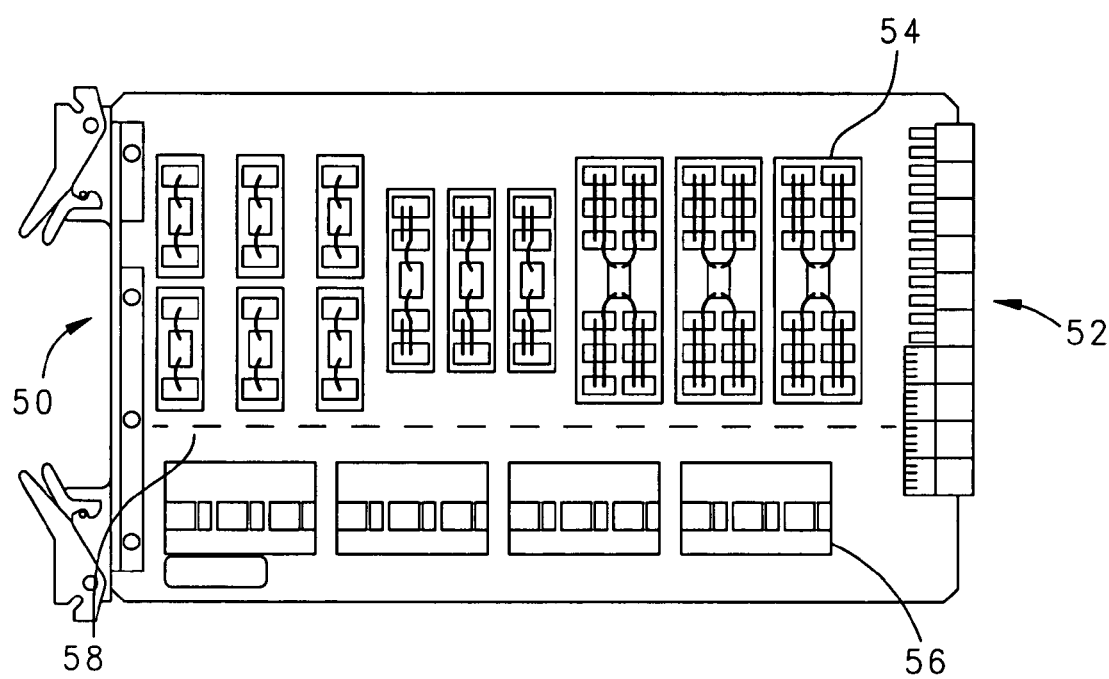
FIG. 3 is a plan view of the inventive circuit board.

FIG. 3 is a plan view of an inventive circuit board 50. Circuit board 50 incorporates a power section 54 receiving a number of separate MOSFETs. Connector 52 is provided as in the prior art. A separate control and communication section 56 is associated with the circuit board 50 and a thermal barrier 58 is provided between the control and communication section 56 and the power section 54. As can be appreciated, the power section 54 carries a number of MOSFETs, and would be hot during operation.

Figure 4:
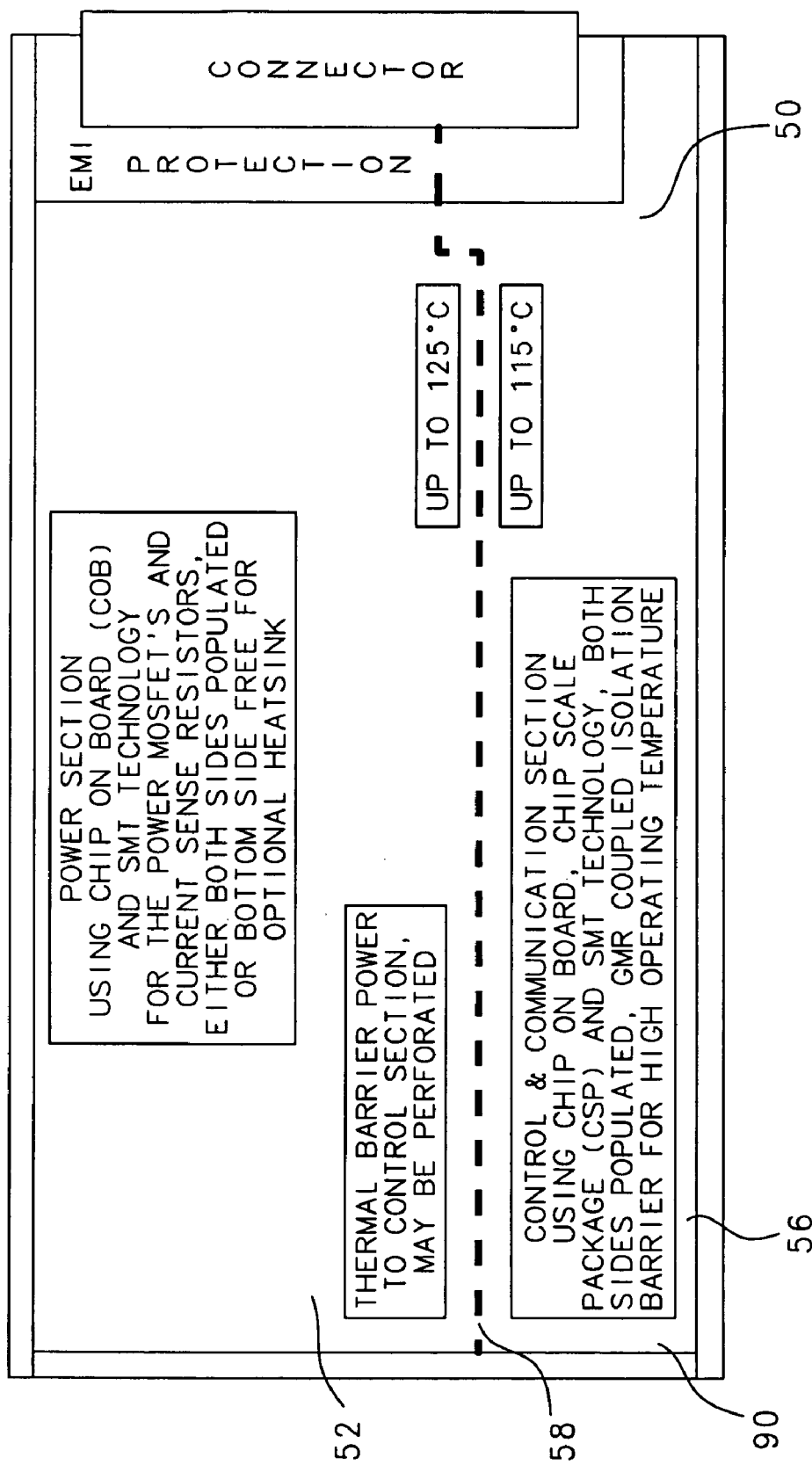
FIG. 4 is a schematic view of the inventive circuit board.

As shown schematically in FIG. 4, the control and communication section 56 carries the control circuits (SMTs, as an example) for each of the individual MOSFETs, and the resistors. Further, as in the prior art, control circuits for controlling the overall board function are placed in the control and communication section 56. The thermal barrier 58 may be formed by perforating a board substrate 90, or by limiting the amount of copper traces along the thermal barrier 58 to limit the heat coupling between the power section 54, and control and communication section 56. By limiting the amount of copper, a material forming the board substrate 90 (e.g., FR4) provides a good thermal break and insulator.

Figure 5:
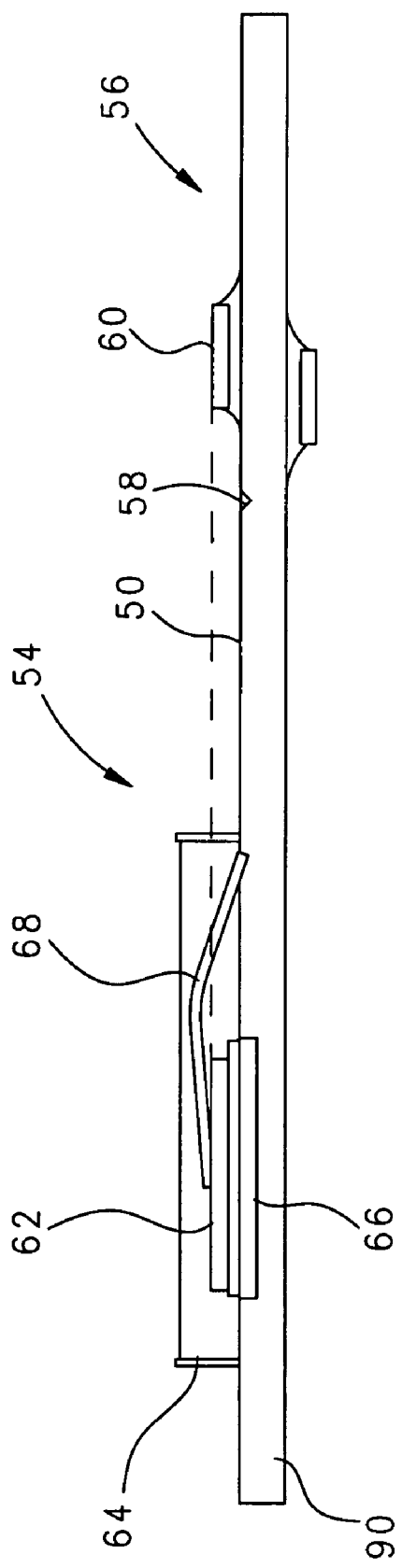
FIG. 5 is a cross-sectional view through the inventive circuit board.

As can be appreciated from FIG. 5, the control and communication section 56 carries the control circuit 60 for each MOSFET, and the thermal barrier 58 is formed between the control and communication section 56 and power section 54. The MOSFETs 62/66 are each mounted as a naked die directly to the underlying board substrate 90, and a wire bond 68 may connect the MOSFETs 62/66 to the board substrate 90. Potting material 64 may also protect the MOSFET and the wire bond 68.

As can be appreciated, and as shown in dotted line in FIG. 5, each MOSFET 62/66 is electrically communicated with its associated control circuit 60 by a circuit trace. Thus, the present invention requires a good deal fewer assembly steps in that the MOSFETs and associated controls are not assembled as a unit, but rather are mounted to the board as separate parts that are later communicated.

The present invention also better utilizes space and ensures that the density of power semiconductors per unit area of board is increased. As can be appreciated, at least some of the MOSFETs are positioned closer to each other in the power section than they are to their respective control circuits which are located in the control section. Similarly, the respective control circuits would be positioned closer to each other than they are to their respective MOSFETs. While the control circuit for each individual MOSFET may be maintained separately within the control section, it is also within the scope of this invention that the several control circuits be combined as part of a single control circuit. In such a case, the individual control functions for each MOSFET would still be accomplished by a control mounted within the control section, and such an embodiment would still come within the scope of an "individual control circuit" for each of the power semi conductors or MOSFETs.

Again, while MOSFETs are specifically disclosed, a circuit board incorporating other types of power semiconductors like IGBTs, thyristors, SCRs, diodes, etc. will also benefit from this invention.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A circuit board comprising:
a board substrate;
a plurality of power semiconductors mounted in a power section on said board substrate, a plurality of individual control circuits, each of said power semiconductors being associated with a respective one of said individual control circuits, said individual control circuits being mounted in a control section on said board substrate, and each of said power semiconductors and said respective one of said individual control circuits being electrically connected;
wherein a thermal barrier is placed between said control section and said power section, said thermal barrier formed by a perforation.

2. The circuit board as set forth in claim 1, wherein said power semiconductors are mounted directly to said board substrate.

3. The circuit board as set forth in claim 1, wherein said power semiconductors and said individual control circuits are mounted to said board substrate separately and in a spaced relationship.

4. The circuit board as set forth in claim 1, wherein said individual control circuits are maintained as separate circuit elements in said control section.

5. The circuit board as set forth in claim 1, wherein said power semiconductors are MOSFETs.

6. The circuit board as set forth in claim 1, wherein a common control circuit for the entirety of said board is also provided in said control section.

7. The circuit board as set forth in claim 1, wherein at least some of said plurality of individual control circuits are spaced closer to each other in said control section than they are to the respective power semiconductors, and at least some of said plurality of power semiconductors are positioned closer to each other than they are to their respective individual control circuits.

8. A circuit board comprising:
a board substrate, said board substrate defining a thermal break separating said board substrate into a power section and a control section, said thermal break formed by a perforation;
a plurality of power semiconductors mounted in said power section, at least a plurality of said power semiconductors being metal oxide semiconductor field effect transistors, and a plurality of said power semiconductors being associated with an individual control circuit of a plurality of individual control circuits in said control section.

9. The circuit board as set forth in claim 8, wherein a common control circuit for the entirety of said board is also provided in said control section.

10. The circuit board as set forth in claim 8, wherein at least some of said plurality of individual control circuits are spaced closer to each other in said control section than they are to the respective power semiconductors, and at least some of said plurality of power semiconductors are positioned closer to each other than they are to their respective individual control circuits.

* * * * *